United States Patent [19]
Ugajin et al.

[11] Patent Number: 5,643,828
[45] Date of Patent: Jul. 1, 1997

[54] MANUFACTURING METHOD OF A QUANTUM DEVICE

[75] Inventors: Ryuichi Ugajin; Ichiro Hase, both of Kanagawa; Kazumasa Nomoto, Tokyo, all of Japan

[73] Assignee: Sony Corporation, Tokyo, Japan

[21] Appl. No.: 574,785

[22] Filed: Dec. 19, 1995

Related U.S. Application Data

[62] Division of Ser. No. 105,121, Aug. 12, 1993, abandoned.

[30] Foreign Application Priority Data

Aug. 13, 1992 [JP] Japan .................................. 4-237723
Sep. 30, 1992 [JP] Japan .................................. 4-285341

[51] Int. Cl.$^6$ .................................................. H01L 21/20
[52] U.S. Cl. .......................... 437/133; 437/105; 437/126; 437/129
[58] Field of Search .................................. 437/126, 129, 437/133, 105

[56] References Cited

U.S. PATENT DOCUMENTS 5,313,484  5/1994  Arimoto ................................. 437/129

FOREIGN PATENT DOCUMENTS 0170044  2/1986  European Pat. Off. ..

OTHER PUBLICATIONS

Fukai et al in "Appl. Phys. Letts 58(18) 1991 (May), pp. 2018–2020" titled GaAs Tetrahedral Quantum Dot Structures . . . .

Japanese Journal of Applied Physics, Conf. Solid State Devices and Materials 1990 entitled "Fabrication and Optical Characterization of InGaAs/InP Quantum Wires and Dots", pp. 107–110.

*Primary Examiner*—Charles L. Bowers, Jr.
*Assistant Examiner*—Ramamohan Rao Paladugu
*Attorney, Agent, or Firm*—Hill, Steadman & Simpson

[57] ABSTRACT

A method of manufacturing a quantum device such as a coupled quantum boxes device are disclosed. The quantum device comprises: a semiconductor substrate; a plurality of box portions made of a first semiconductor; and a layer made of a second semiconductor provided on circumferences of the box portions, a plurality of quantum boxes being provided with the box portions and the layer of the second semiconductor. The manufacturing method comprises the steps of: making a plurality of box portions of a first semiconductor on a semiconductor substrate; and covering circumferences of the box portions with a layer of a second semiconductor, a plurality of quantum boxes being provided with the box portions and the layer of the second semiconductor.

7 Claims, 8 Drawing Sheets

MANUFACTURING METHOD OF A QUANTUM DEVICE

This is a division of application Ser. No. 105,121, filed Aug. 12, 1992, now abandoned.

BACKGROUND OF THE INVENTION

1. Field of the Invention

This invention relates to a quantum device and its manufacturing method.

2. Description of the Prior Art

Recently, in quantum wave electronics, a quantum microstructure called a quantum box, which has a cross sectional dimension equivalent to the de Broglie wavelength of an electron, is remarked, and the quantum effect exhibited by a zero-dimensional electron confined in the quantum box has become a matter of great concern.

A concept of a coupled quantum boxes device (also called an assembled quantum boxes device) has arisen as a sort of quantum devices using quantum boxes, and a study has started to realize it. Such a coupled quantum boxes device includes quantum boxes arranged so as to cause transition of electrons (e⁻) among the quantum boxes, due to quantum mechanical tunneling or other mechanism, to thereby change the distribution of electrons to effect information processing.

In order to realize a coupled quantum boxes device which utilizes tunneling of electrons among quantum boxes, it is necessary to arrange the quantum boxes in near positional relations by a distance less than the order of 10 nm.

Quantum boxes of a size on the order of 10 nm can be made by the electron beam lithography. As to the distance between the quantum boxes, however, the order of 50 nm is the limit because of the proximity effect and scattering of electrons during exposure. With the distance on the order of 50 nm between quantum boxes, the coupling force between the quantum boxes is very weak, and the operation speed of the coupled quantum boxes device is slow.

Such a decrease in operation speed similarly occurs also in a coupled quantum wires device which is a quantum device using quantum wires in lieu of quantum boxes.

OBJECTS AND SUMMARY OF THE INVENTION

It is an object of the invention to increase the coupling between quantum boxes or quantum wires in a quantum device by decreasing the distance between the quantum boxes or quantum wires to the order of 10 nm by making an epitaxially grown layer of a sufficient thickness on side walls of the quantum boxes or quantum wires.

A further object of the invention is to provide a coupled quantum boxes device or a coupled quantum wires device operative at a high speed by increasing the coupling strength between quantum boxes or quantum wires by using a channel layer between the quantum boxes or quantum wires to permit electrons to readily move from one quantum box or one quantum wire to another through the channel layer.

A still further object of the invention is to easily make a channel layer of a highly controlled thickness between quantum boxes or quantum wires.

A yet further object of the invention is to manufacture a coupled quantum boxes device or a coupled quantum wires device having an increased coupling strength between quantum boxes or quantum wires by using a channel layer between the quantum boxes or quantum wires and operative at a high speed.

A yet further object of the invention is to manufacture a coupled quantum boxes device or a coupled quantum wires device having an increased coupling strength between quantum boxes or quantum wires and hence operative at a high speed by forming an epitaxially grown layer on side walls of the quantum boxes or quantum wires to decrease the distance between the quantum boxes or quantum wires by an amount twice the thickness of the epitaxially grown layer.

A yet further object of the invention is to provide a coupled quantum boxes device having a large degree of freedom in design by controlling the electron transition probability between quantum boxes by controlling the distance and/or the relative angle between the quantum boxes.

A yet further object of the invention is to control the electron transition probability between quantum boxes by varying the relative angle between the quantum boxes even when the quantum boxes are periodically arranged, that is, the density of the quantum boxes is fixed.

A yet further object of the invention is to obtain a remarkable quantum effect by enhancing the wave nature of electrons confined in quantum boxes by utilizing the fact that, when the difference $E_1 - E_0$ between the first quantum level $E_0$ and the second quantum level $E_1$ of the quantum boxes is equivalent to or larger than the thermal energy kT (k: Boltzmann constant, T: operating temperature of device), the energy levels of the quantum boxes become sufficiently discrete.

In accordance with an aspect of the present invention, there is provided a method for manufacturing a quantum device comprising the steps of: providing a plurality of box portions made of a first semiconductor on a semiconductor substrate; and covering circumferences of the box portions with a layer made of a second semiconductor, a plurality of quantum boxes being provided by the box portion and the layer of a second semiconductor.

In accordance with a further aspect of the present invention, there is provide a quantum device comprising: a semiconductor substrate; a plurality of box portions made of a first semiconductor; and a layer of a second semiconductor on circumferences of the box portions, a plurality of quantum boxes being provided by the box portions and the layer of a second semiconductor.

The above, and other, objects, features and advantage of the present invention will become readily apparent from the following detailed description thereof which is to be read in connection with the accompanying drawings.

BRIEF DESCRIPTION OF THE DRAWINGS

FIGS. 10 to 11 are perspective views for explaining a method for manufacturing the coupled quantum dots device shown in FIG. 9;

DESCRIPTION OF THE PREFERRED EMBODIMENTS

Before describing embodiments of the invention, explained below in detail is the reason why the operation speed decreases when the distance among quantum boxes is large in a coupled quantum boxes device using the tunneling of electrons among the quantum boxes.

In this text, a quantum box is referred to as a quantum dot, and a device made by combining a plurality of quantum dots is referred to as a coupled quantum dots device. The explanation given below is directed to a coupled quantum dots device.

Figure 1:
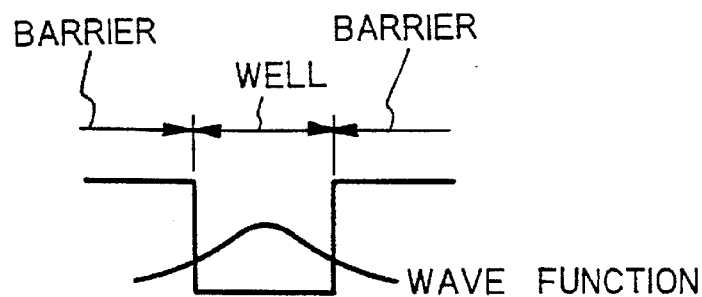
FIG. 1 is a schematic view conceptually showing the potential well of a single quantum dot and the wave function in the ground state of an electron in the potential well.

Quantum dots are made by surrounding in three dimensions dot-shaped wells with a barrier layer. The potential well of a single quantum dot and the wave function in the ground state of an electron in the potential well are conceptually shown in FIG. 1.

Figure 2:
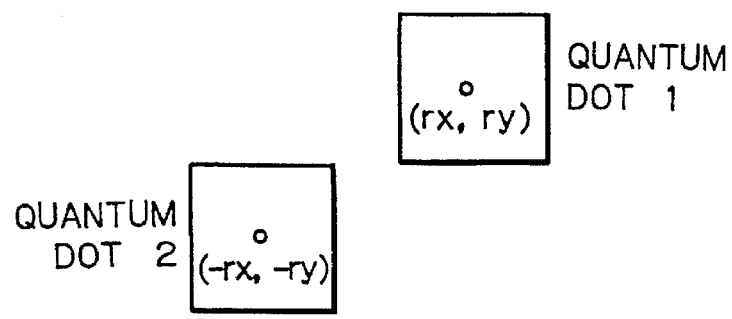
FIG. 2 is a schematic view showing a coupled quantum dots system including two quantum dots.

Let us now consider a coupled quantum dots system including two quantum dots as shown in FIG. 2. Consideration on the dynamics of electrons in the coupled quantum dots system is made based on the LCAO (Linear Combination of Atomic Orbitals) approximation known as an effective approximation for considering the electronic state of a hydrogen molecular ion ($H_2^+$) from an exact solution of the electronic state of an isolated hydrogen atom.

On the basis of the LCAO approximation, when a quantum dot 1 and a quantum dot 2, initially isolated, approach to each other, a split of the width $2\Delta E$ occurs in the energy level $E_0$ in the ground states of the electron in the quantum dot 1 and the electron in the quantum dot 2, and two states, bonding state and antibonding state, are obtained. Energies and wave functions of these bonding and antibonding states are shown by:

Bonding State $E_{bonding}=E_0-\Delta E$

Antibonding State $E_{antibonding}=E_0+\Delta E$ (1)

$|bonding\rangle \propto [|1\rangle+|2\rangle]$ $|antibonding\rangle \propto [|1\rangle-|2\rangle]$ (2)

$\Delta E$ is called transfer energy, and it gives a criterion for determination of the tunneling time $\tau$ of an electron between quantum dots as referred to later.

If the Hamiltonian of the coupled quantum dots system is expressed as $\hat{H}_{LCAO}$, then the bonding state $|bonding\rangle$ and the antibonding state $|antiboning\rangle$ exhibit eigen states of the Hamiltonian as indicated by the following equation:

$$\hat{H}_{LCAO}|bonding\rangle=(E_0-\Delta E)|bonding\rangle$$

$$\hat{H}_{LCAO}|antibonding\rangle=(E_0+\Delta E)|antibonding\rangle \quad (3)$$

Assuming now that an electron is localized in, for example, the quantum dot 1, this state can be expressed as:

$$|initial\rangle = \frac{1}{\sqrt{2}}[|bonding\rangle+|antibonding\rangle] \quad (4)$$

By time evolution from this state in accordance with the Schroedinger equation, the state at the time t is:

$$|t\rangle = \exp\left(i\frac{\hat{H}_{LCAO}t}{\hbar}\right)|initial\rangle =$$

$$\frac{1}{\sqrt{2}}\left[\exp\left(i\frac{\hat{H}_{LCAO}t}{\hbar}\right)|bonding\rangle + \exp\left(i\frac{\hat{H}_{LCAO}t}{\hbar}\right)|antibonding\rangle\right] =$$

$$\frac{1}{\sqrt{2}}\left[e^{i\frac{(E_0-\Delta E)t}{\hbar}}|bonding\rangle + e^{i\frac{(E_0+\Delta E)t}{\hbar}}|antibonding\rangle\right] = \frac{1}{\sqrt{2}}e^{i\frac{(E_0-\Delta E)t}{\hbar}}\left[|bonding\rangle + e^{i\frac{2\Delta Et}{\hbar}}|antibonding\rangle\right] \quad (5)$$

It is known from the above statement that the electron heretofore localized in the quantum dot 1 reaches the quantum dot 2 at the time t satisfying:

$$\frac{2\Delta Et}{\hbar} = \pi \quad (6)$$

Therefore, it may be considered that, in the range of the LCAO approximation, the tunneling time $\tau$ of the electron from the quantum dot 1 to the quantum dot 2 is:

$$\tau = \frac{\pi\hbar}{2\Delta E} \quad (7)$$

This tunneling time $\tau$ may more generally be expressed as:

$$\tau \sim \frac{\pi \hbar}{2\Delta E} \quad (8)$$

It is known from the foregoing statement that, by most simplifying the dynamics of electrons in a coupled quantum dots system, electrons move owing to tunnelling dependent on the magnitude of the transfer energy $\Delta E$ between quantum dots.

Sought below is a formula for the transfer energy $\Delta E$ in the range of the LCAO approximation.

A single square quantum dot having the length $2d$ of an edge is now taken for consideration. Then its potential energy is:

$$V(x,y) = \begin{cases} -V_0 & (|x| \leq d, |y| \leq d) \\ 0 & (|x| > d, |y| > d) \end{cases} \quad (9)$$

Therefore, the Hamiltonian of the system is:

$$\hat{H}_{isolate} = K + V(x,y) \quad (10)$$

where K is the kinetic energy. When the ground state of the Hamiltonian is expressed as $|\psi_0\rangle$ and the energy thereof is expressed as $E_0$, $$\hat{H}_{isolate}|\psi_0\rangle = E_0|\psi_0\rangle \quad (11)$$

is established.

In contrast, the Hamiltonian of a coupled quantum dot system including two square quantum dots (see FIG. 2) can be expressed by the following equation:

$$\hat{H}_{coupled} = K + V_+(x,y) + V_-(x,y) \quad (12)$$

However, when the center coordinates of one of the quantum dots and the center coordinates of the other quantum dot are described as shown in FIG. 2, $$V_+(x,y) = V(x-\tau_x, y-\tau_y)$$
$$V_-(x,y) = V(x+\tau_x, y+\tau_y) \quad (13)$$

On the other hand, the wave function in the ground state of the Hamiltonian of the single square quantum dot expressed by equation (10) is:

$$\psi_0(x,y) = \langle x,y|\psi_0\rangle \quad (14)$$

However, $$\psi_{0+}(x,y) = \psi_0(x-\tau_x, y-\tau_y)$$
$$\psi_{0-}(x,y) = \psi_0(x+\tau_x, y+\tau_y) \quad (15)$$

satisfy $$[K+V_+]\psi_{0+}(x,y) = E_0\psi_{0+}(x,y)$$
$$[K+V_-]\psi_{0-}(x,y) = E_0\psi_{0-}(x,y) \quad (16)$$

After the foregoing preparation, energy eigenvalues of the Hamiltonian of the coupled quantum dots system shown by equation (12) is sought in the two-dimensional subspace spanned by the eigenstates of the single square quantum dot expressed by equation (15). Since two eigenstates expressed by equation (15) are not orthogonal, the orthogonal bases are made, for example, as follows:

$$|a\rangle = \frac{1}{\sqrt{2(1-\langle\psi_{0-}|\psi_{0+}\rangle)}} (|\psi_{0+}\rangle - |\psi_{0-}\rangle) \quad (17)$$

$$|b\rangle = \frac{1}{\sqrt{2(1+\langle\psi_{0-}|\psi_{0+}\rangle)}} (|\psi_{0+}\rangle + |\psi_{0-}\rangle)$$

On the basis of the orthogonal bases, Hamiltonian matrix elements are calculated as follows:

$$\langle a|\hat{H}_{coupled}|a\rangle = \frac{1}{2(1-\langle\psi_{0-}|\psi_{0+}\rangle)} (\langle\psi_{0+}|-\langle\psi_{0-}|)[K+V_++V_-](|\psi_{0+}\rangle-|\psi_{0-}\rangle) = \quad (18)$$

$$\frac{1}{2(1-\langle\psi_{0-}|\psi_{0+}\rangle)} (\langle\psi_{0+}|-\langle\psi_{0-}|)[(K+V_+)|\psi_{0+}\rangle + V_-|\psi_{0+}\rangle - V_+|\psi_{0-}\rangle - (K+V_-)|\psi_{0-}\rangle] =$$

$$\frac{1}{2(1-\langle\psi_{0-}|\psi_{0+}\rangle)} (\langle\psi_{0+}|-\langle\psi_{0-}|)[E_0|\psi_{0+}\rangle + V_-|\psi_{0+}\rangle - V_+|\psi_{0-}\rangle - E_0|\psi_{0-}\rangle] =$$

$$\frac{1}{2(1-\langle\psi_{0-}|\psi_{0+}\rangle)} (\langle\psi_{0+}|-\langle\psi_{0-}|)[E_0|\psi_{0+}\rangle + V_-|\psi_{0+}\rangle - V_+|\psi_{0-}\rangle - E_0|\psi_{0-}\rangle] =$$

$$\frac{1}{2(1-\langle\psi_{0-}|\psi_{0+}\rangle)} (\langle\psi_{0+}|-\langle\psi_{0-}|)[E_0|\psi_{0+}\rangle + V_-|\psi_{0+}\rangle - V_+|\psi_{0-}\rangle - E_0|\psi_{0-}\rangle] =$$

$$\frac{1}{2(1-\langle\psi_{0-}|\psi_{0+}\rangle)} [2E_0(1-\langle\psi_{0-}|\psi_{0+}\rangle) + 2\langle\psi_{0+}|V_-|\psi_{0+}\rangle - 2\langle\psi_{0+}|V_+|\psi_{0-}\rangle] = E_0 + \frac{\langle\psi_{0+}|V_-|\psi_{0+}\rangle - \langle\psi_{0+}|V_+|\psi_{0-}\rangle}{1-\langle\psi_{0-}|\psi_{0+}\rangle}$$

$$\langle b|\hat{H}_{coupled}|b\rangle = \frac{1}{2(1+\langle\psi_{0-}|\psi_{0+}\rangle)} (\langle\psi_{0+}|+\langle\psi_{0-}|)[K+V_++V_-](|\psi_{0+}\rangle+|\psi_{0-}\rangle) = \quad (19)$$

$$\frac{1}{2(1+\langle\psi_{0-}|\psi_{0+}\rangle)} (\langle\psi_{0+}|+\langle\psi_{0-}|)[(K+V_+)|\psi_{0+}\rangle + V_-|\psi_{0+}\rangle + V_+|\psi_{0-}\rangle + (K+V_-)|\psi_{0-}\rangle] =$$

$$\frac{1}{2(1+<\psi_{0-}|\psi_{0+}>)} (<\psi_{0+}|+<\psi_{0-}|)[E_0|\psi_{0+}>+V_-|\psi_{0+}>+V_+|\psi_{0-}>+E_0|\psi_{0-}>] =$$

$$\frac{1}{2(1+<\psi_{0-}|\psi_{0+}>)} (<\psi_{0+}|+<\psi_{0-}|)[E_0|\psi_{0+}>+V_-|\psi_{0+}>+V_+|\psi_{0-}>+E_0|\psi_{0-}>] =$$

$$\frac{1}{2(1+<\psi_{0-}|\psi_{0+}>)} (<\psi_{0+}|+<\psi_{0-}|)[E_0|\psi_{0+}>+V_-|\psi_{0+}>+V_+|\psi_{0-}>+E_0|\psi_{0-}>] =$$

$$\frac{1}{2(1+<\psi_{0-}|\psi_{0+}>)} [2E_0(1+<\psi_{0-}|\psi_{0+}>)+2<\psi_{0+}|V_-|\psi_{0+}>+2<\psi_{0+}|V_+|\psi_{0-}>] == E_0 + \frac{<\psi_{0+}|V_-|\psi_{0+}>+<\psi_{0+}|V_+|\psi_{0-}>}{1+<\psi_{0-}|\psi_{0+}>}$$

$<b|\hat{H}_{coupled}|a>=0$  (20)

$<a|\hat{H}_{coupled}|b>=0$  (21)

Note, however, that the calculation of these matrix elements uses equation (16) and the following equations:

$<\psi_{0+}|V_-|\psi_{0+}>=<\psi_{0-}|V_+|\psi_{0-}>$ $<\psi_{0+}|V_-|\psi_{0-}>=<\psi_{0+}|V_+|\psi_{0-}>$  (22)

As understood from equations (20) and (21), since non-diagonal elements of the Hamiltonian matrix are all zeroes, the Hamiltonian matrix is in fact diagonalized. Therefore, energy eigenvalues are:

$<b|\hat{H}_{coupled}|b>$, $<a|\hat{H}_{coupled}|a>$ and their eigenvectors are:

$|b>=|bonding>$, $|a>=|antibonding>$  (23)

In equations (18) and (19), because of the localization of the wave function, the following relations are established:

$1>><\psi_{0-}|\psi_{0+}>$ $<\psi_{0+}|V_-|\psi_{0+}><<<\psi_{0+}|V_+|\psi_{0-}>$  (24)

Therefore, energies may be considered to be:

$E_{antibonding} \sim E_0 + \Delta E$ $E_{bonding} \sim E_0 - \Delta E$ $\Delta E = |<\psi_{0+}|V_+|\psi_{0-}>|$  (25)

It is known from equation (8) that, when the transfer energy ΔE is small, the electron tunneling time between quantum dots increases. On the other hand, when the distance between quantum dots is large, the coupling strength between the quantum dots becomes weak, and the transfer energy ΔE at that time becomes small. Therefore, when the distance between quantum dots is large, the electron tunneling time between the quantum dots increases, and the operating speed of the entirety of the coupled quantum dots device becomes slow.

Figure 3:
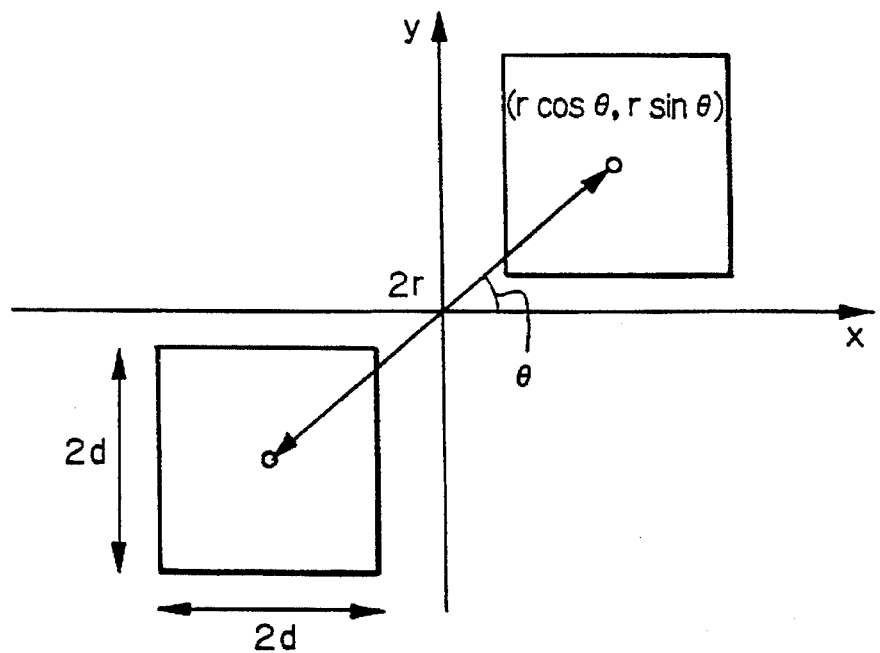
FIG. 3 is a schematic view showing the distance and the relative angle between quantum dots in a coupled quantum dots system including two square quantum dots.
Figure 4:
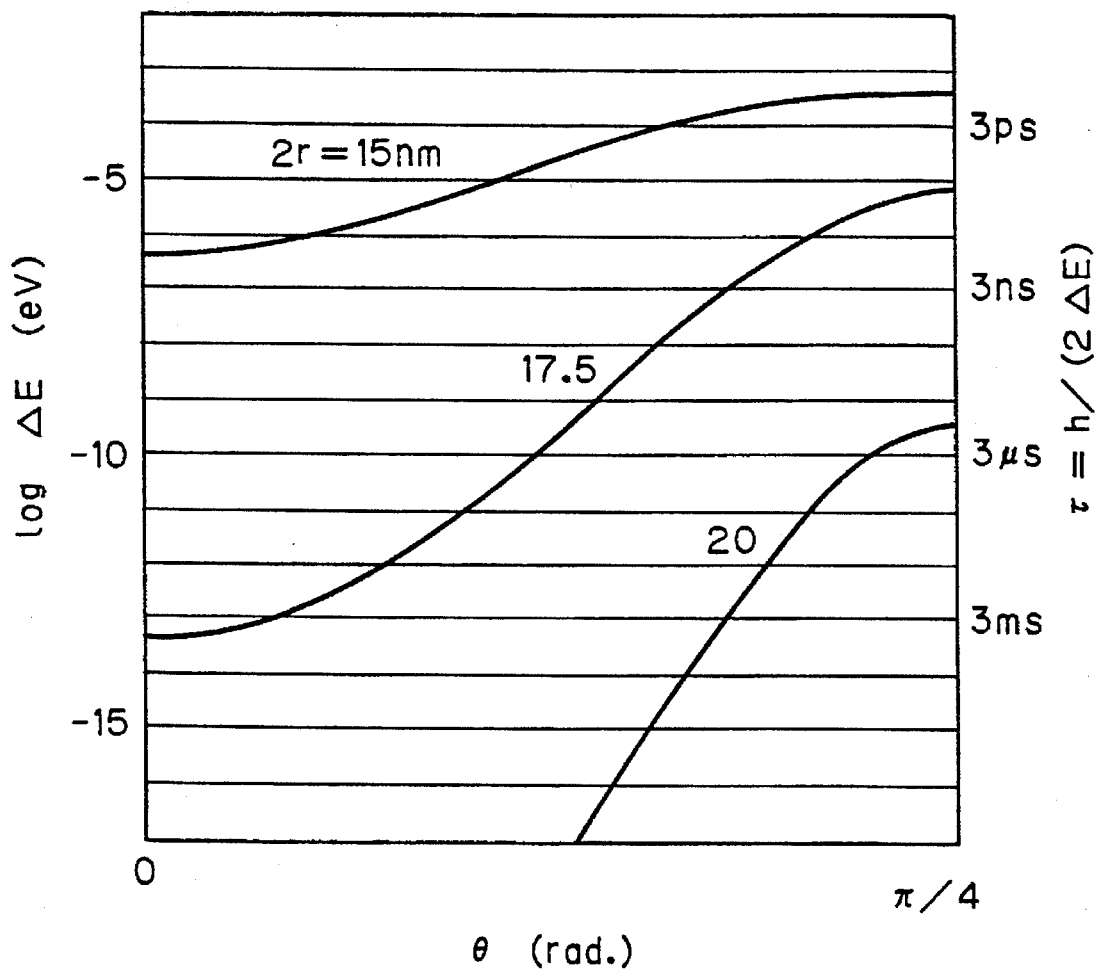
FIG. 4 is a graph showing changes in transfer energy ΔE and in tunneling time τ in the coupled square quantum dots system shown in FIG. 3 with the relative angle θ.

On the basis of the theory stated above, precise calculation of the transfer energy ΔE was done on a coupled quantum dots system having two-dimensional square quantum dots as shown in FIG. 3. A result of the calculation is shown in FIG. 4. The calculation was done on a quantum dot of a GaSb (barrier)/InAs (well) heterostructure which the length of an edge is 2d=10 nm, the effective mass of an electron in the quantum dot, that is, in the well portion made of InAs, is $m_{InAs}=0.027\ m_e$ ($m_e$ is the mass of an electron in vacuum), the effective mass of an electron outside the quantum dot, that is, in the barrier portion made of GaSb, is $m_{GaSb}=0.049\ m_e$, and the height of the potential barrier at the GaSb/InAs heterointerface is $V_0=0.8$ eV.

In FIG. 4, even when the distance between quantum dots is 2r=15 nm and the relative angle is θ=0, the tunneling time τ is several tenths nanoseconds. As for 2r=17.5 nm and θ=0, the tunneling time τ is the order of milliseconds. If it takes such a long time for the electron tunneling between quantum dots, which is an elementary process in a coupled quantum dots device, then the entire operating speed of the coupled quantum dots device becomes very slow.

It is known from FIG. 4 that, even when the distance 2r between the quantum dots is fixed, ΔE largely varies with their relative angle θ. For example, in case of 2r=17.5 nm, as θ varies in the range of 0~π/4, ΔE varies by eight orders of magnitude or more. Accordingly, the electron tunneling time τ between quantum dots also varies by as much as eight orders of magnitude or more.

Embodiments of the invention are described below with reference to the drawings.

Figure 5:
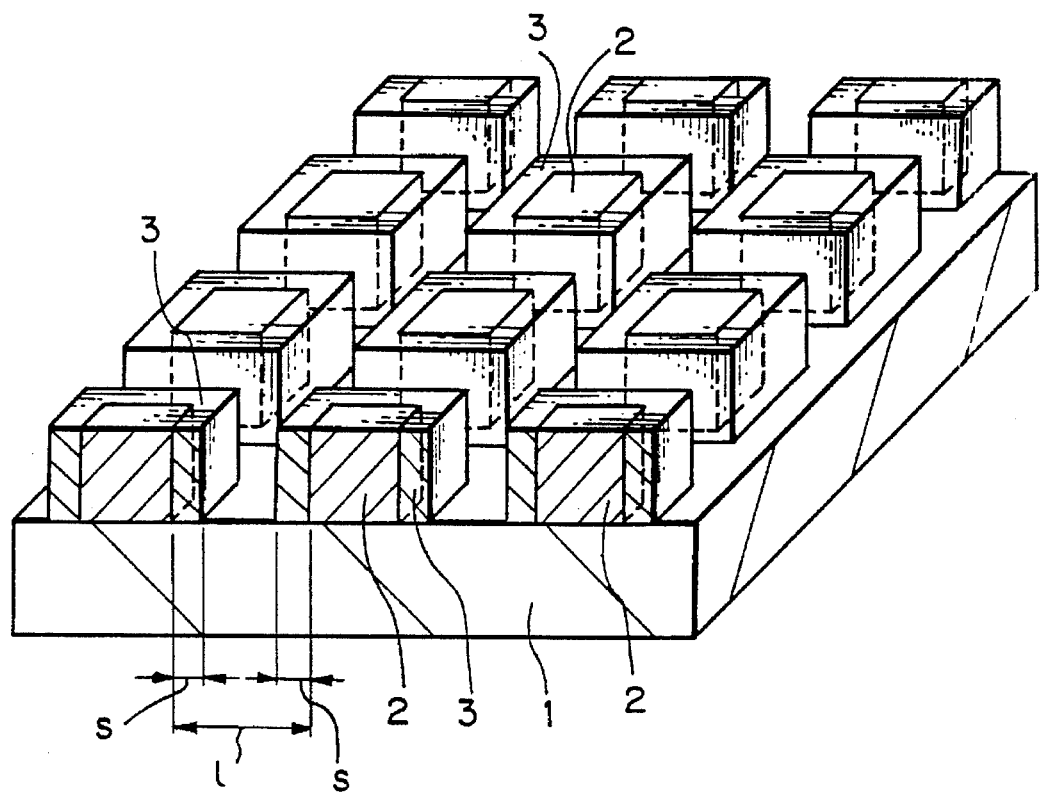
FIG. 5 is a perspective view showing a coupled quantum dots device according to a first embodiment of the invention.

FIG. 5 shows a coupled quantum dots device according to a first embodiment of the invention.

As shown in FIG. 5, in the coupled quantum dots device according to the first embodiment, a plurality of quadrangular prismatic quantum dots 2 made of, for example, GaAs are arranged periodically at constant intervals on, for example, an AlGaAs substrate 1. The device actually includes an AlGaAs layer which covers the quantum dots 2 as the barrier layer. The drawings, however, omit the barrier layer for simplifying the illustration. In this case, the AlGaAs layer and the AlGaAs substrate 1 behave as the barrier layer for the quantum dots 2 as quantum well portions. The length of one edge of each quantum dot 2 is, for example, the order of 10 nm. The AlGaAs substrate 1 may be prepared by epitaxially growing an AlGaAs layer on a GaAs substrate.

In the first embodiment, for example, a GaAs layer 3 which is the same material as that of the quantum dots 2, is provided on side walls of the quantum dots 2. In this case, the GaAs layer 3 makes a part of the quantum dots 2. The GaAs layer 3 may be provided either on side walls of all quantum dots 2 or on side walls of quantum dots 2 at only selective portions required for a desired use of the coupled quantum dots device.

When the distance between quantum dots 2 without the GaAs layer 3 is 1, and the width (thickness) of the GaAs layer 3 is s, then the distance 1' between quantum dots 2 with the GaAs layer 3 therebetween becomes 1'=1−2s. That is, in the first embodiment including the GaAs layer 3 provided on side walls of the quantum dots 2, the distance between quantum dots 2 is effectively reduced by twice the width of the GaAs layer 3 as compared with a case without the GaAs layer 3 on side walls of quantum dots 2.

The coupled quantum dots device according to the first embodiment can be manufactured as follows.

Figure 6:
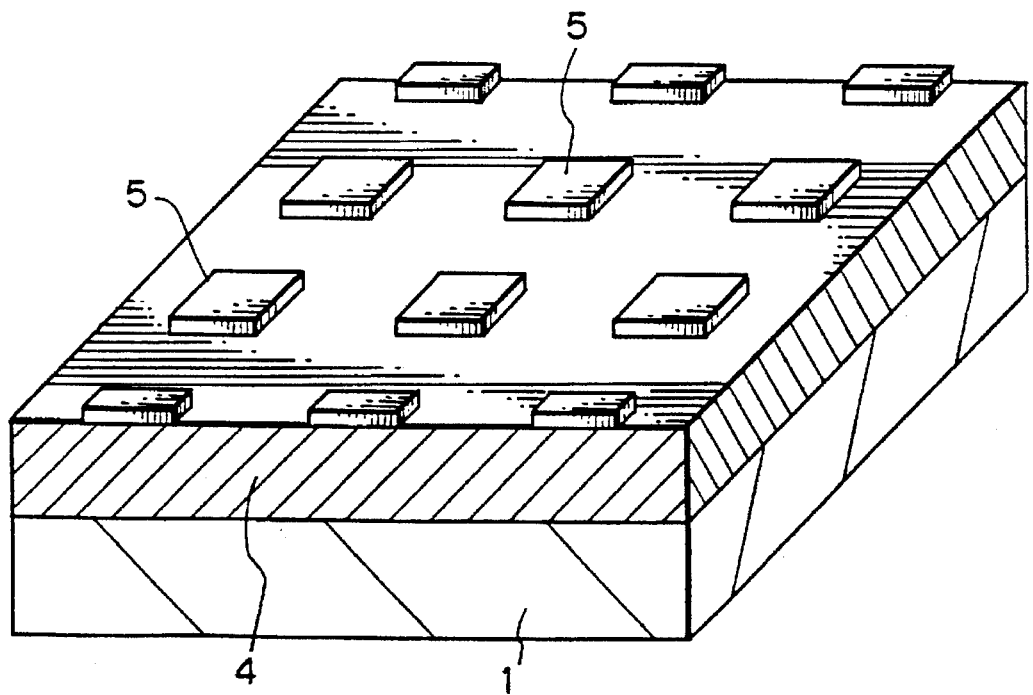
FIGS. 6 to 8 are perspective views for explaining a method for manufacturing the coupled quantum dots device shown in FIG. 5.

As shown in FIG. 6, a GaAs layer 4 is epitaxially grown on the AlGaAs substrate 1 by, for example, the metallorganic chemical vapor deposition (MOCVD) method or the molecular beam epitaxy (MBE) method. The thickness of the GaAs layer 4 is selected to be equivalent to the height of quantum dots to be made. Specifically, the thickness is chosen on the order of, for example, 10 nm. After that, a resist pattern 5 of planar figures corresponding to quantum dots to be made is provided on the GaAs layer 4. The resist pattern 5 may be made, for example, by selectively irradiating an electron beam with a sufficiently small beam diameter in an atmosphere of a predetermined source gas to cause decomposition products by the irradiation to deposit on portions to which the beam was irradiated.

Figure 7:
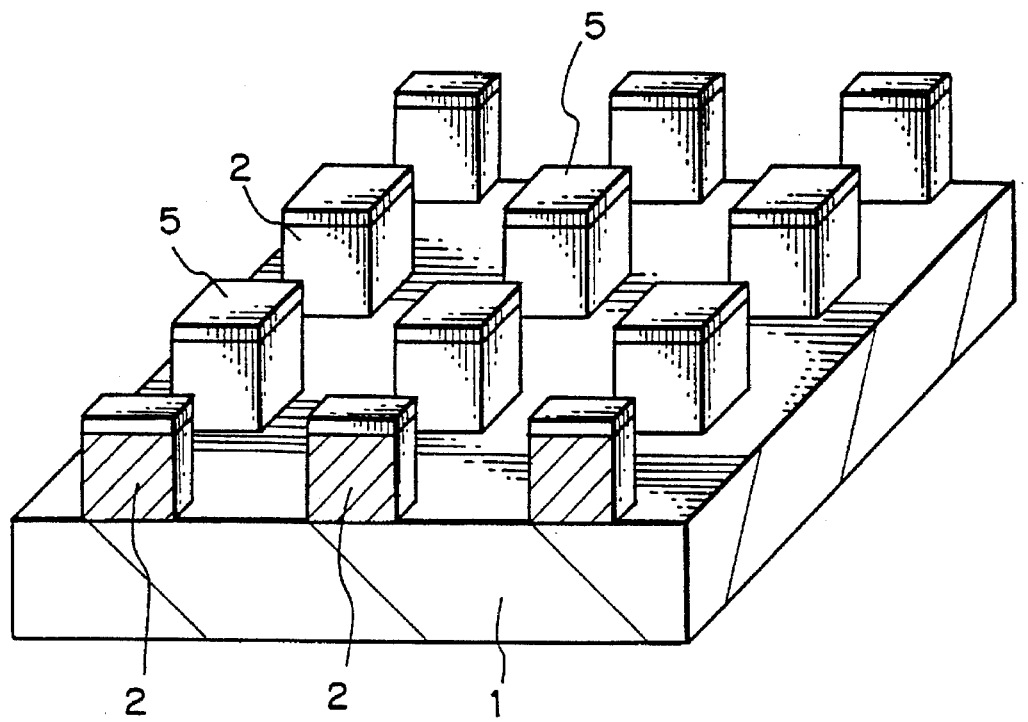

After that, by using the resist pattern 5 as a mask, the GaAs layer 4 is etched in the vertical direction with respect to the substrate surface by a dry etching method such as the reactive ion etching (RIE) method. The dry etching uses, for example, chlorine-based gas as the etching gas. The etching is done until the AlGaAs substrate 1 is exposed. As a result, a plurality of quantum dots 2 of GaAs are made in close but isolated relations as shown in FIG. 7. In this state, the distance between quantum boxes 2 is 1.

Figure 8:
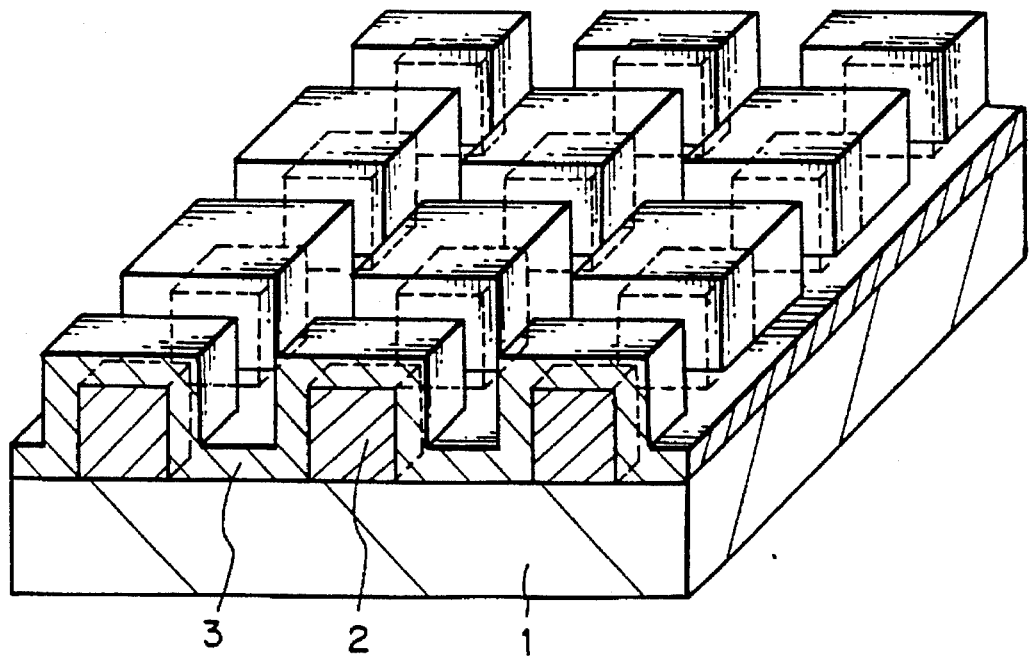

After that, the resist pattern 5 is removed, and, as shown in FIG. 8, for example, the GaAs layer 3 is epitaxially grown on the entire surface of the structure by, for example, the MOCVD method or the MBE method. The thickness of the GaAs layer 3 is s.

After that, the GaAs layer 3 is etched in the vertical direction with respect to the substrate surface by a dry etching method such as the RIE method. This etching is done until upper surfaces of quantum dots 2 are exposed. As a result, the GaAs layer 3 remains only on side walls of the quantum dots 2 as shown in FIG. 5. In this state, the distance between quantum dots 2 effectively becomes 1'=1−2s.

The growth of the GaAs layer 3 onto side walls of quantum dots 2 may be repeated several times, if necessary.

After that, an AlGaAs layer (not shown) as the barrier layer is epitaxially grown on the entire surface of the structure. Then a desired coupled quantum dots device is completed.

As explained above, in the first embodiment, the GaAs layer 3 of the thickness 5 is provided on side walls of quantum dots 2 initially made by the distance 1 so as to make a part of the quantum dots 2, the distance between the quantum dots 2 can effectively be reduced to 1'=1−2s and the coupling strength between the quantum dots 2 can hence be increased by the corresponding amount. Therefore, a coupled quantum dots device operative at a high speed can be realized. Further, the increase in coupling strength between quantum dots 2 contributes to an improvement in resistance against a thermal randomness.

Figure 9:
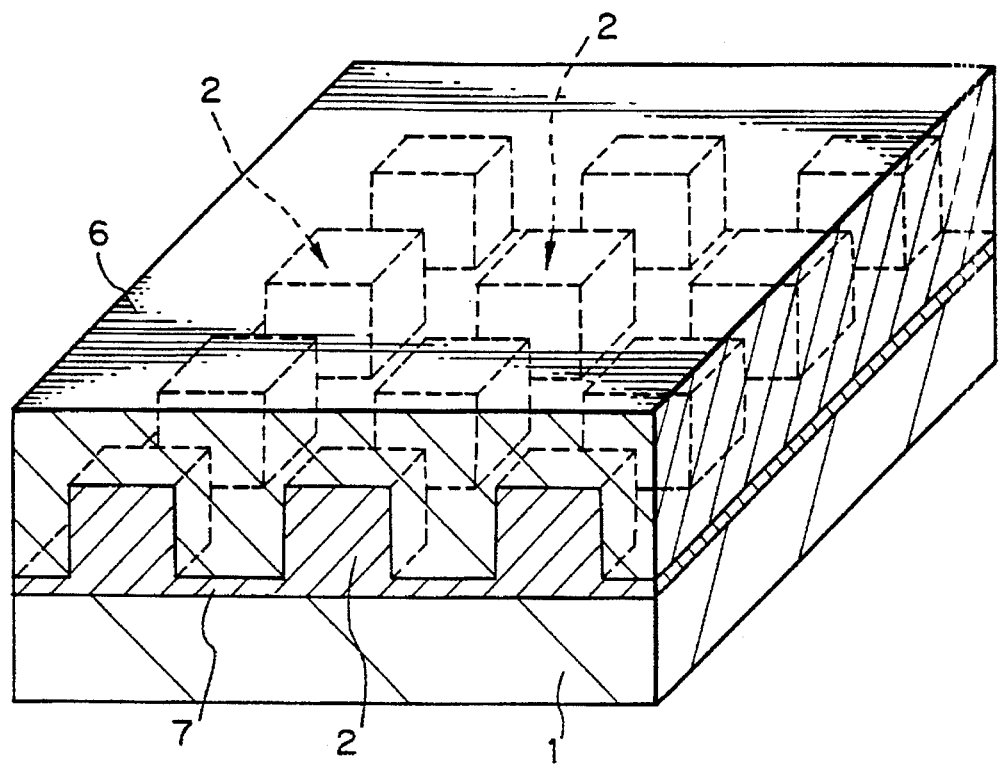
FIG. 9 is a perspective view showing a coupled quantum dots device according to a second embodiment of the invention.

FIG. 9 shows a coupled quantum dots device according to a second embodiment of the invention.

As shown in FIG. 9, in the coupled quantum dots device according to the second invention, a plurality of quadrangular prismatic quantum dots 2 made of, for example, GaAs are periodically arranged at constant intervals on, for example, an AlGaAs substrate 1. An AlGaAs layer 6, for example, is provided on the quantum dots 2 to cover them. In this case, the AlGaAs layer 6 and the AlGaAs substrate 1 behave as the barrier layer of the quantum dots 2 as quantum well portions. The length of one edge of each quantum dot 2 is, for example, the order of 10 nm. The AlGaAs substrate 1 may be made, for example, by epitaxially growing an AlGaAs layer on a GaAs substrate, as in the first embodiment.

The second embodiment includes a channel layer 7 made of, for example, a GaAs layer, provided on the AlGaAs substrate 1 between quantum dots 2 so as to connect the quantum dots 2. The thickness of the channel layer 7 depends on how the coupling strength between the quantum dots 2 is determined. For example, it may be chosen on the order of 1 nm. The channel layer 7 may be provided either among all of the quantum dots 2 or among selected ones of the quantum dots 2 determined for an intended use of the coupled quantum dots device.

In the coupled quantum dots device according to the second embodiment, electrons can move through the channel layer 7 in the area where the quantum dots 2 are connected by the channel layer 7. In this case, since the energy of the electrons in the channel layer 7 is positive, the coupling strength of the quantum dots 2 is very large as compared with cases where electrons move between quantum dots 2 by tunneling.

A method for manufacturing the coupled quantum dots device according to the second embodiment is explained below.

Figure 10:
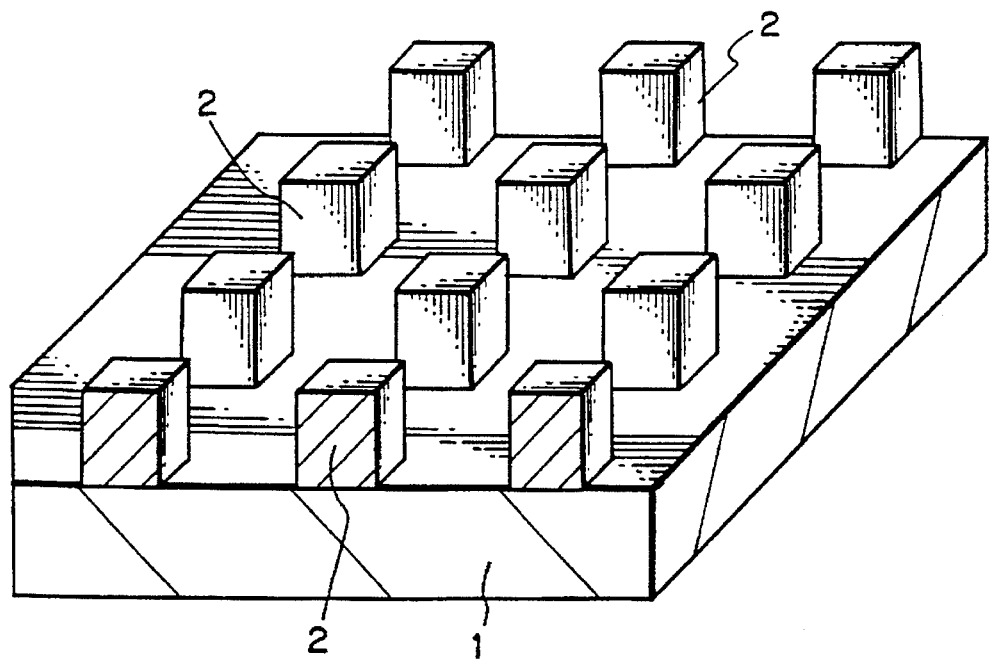
Figure 1:
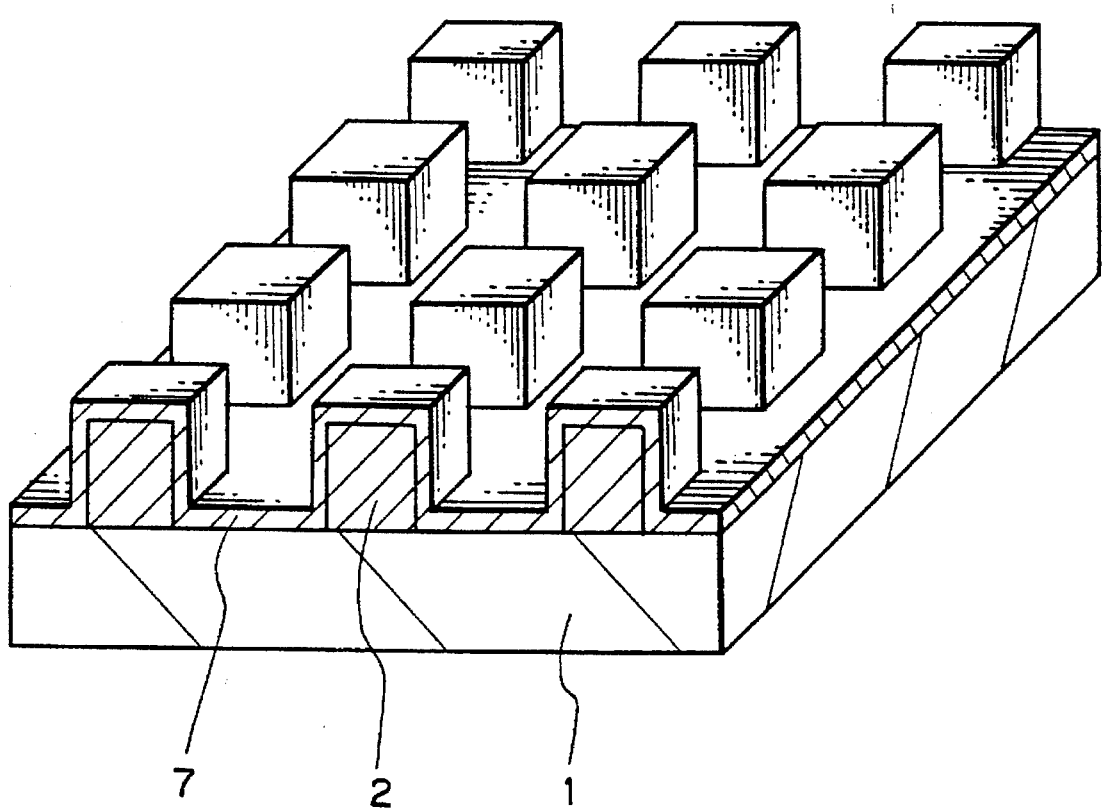

As shown in FIG. 10, a plurality of quantum dots 2 of GaAs are made on the AlGaAs substrate 1 in the same manner as in the first embodiment.

After that, as shown in FIG. 11, the channel layer 7 made of, for example, a GaAs layer, is epitaxially grown on the entire surface of the structure by, for example, the MOCVD method or the MBE method. In this case, the channel layer 7 epitaxially grown on side walls and upper faces of quantum dots 2 make part of the quantum dots 2.

After that, as shown in FIG. 9, the AlGaAs layer 6 is epitaxially grown on the entire surface of the structure. Then a coupled quantum dots device is completed.

As explained above, by using the channel layer 7 which connects quantum dots 2, the second embodiment can sufficiently increases the coupling strength between quantum dots 2 and can hence realize a coupled quantum dots device operative at a high speed. Further, like the first embodiment, the increase in coupling strength between quantum dots 2 contributes to an improvement in resistance against a thermal randomness.

Third to fifth embodiments, explained below, control the electron tunneling time τ between quantum dots, that is, the transition probability, by controlling ΔE referred to above.

Figure 12:
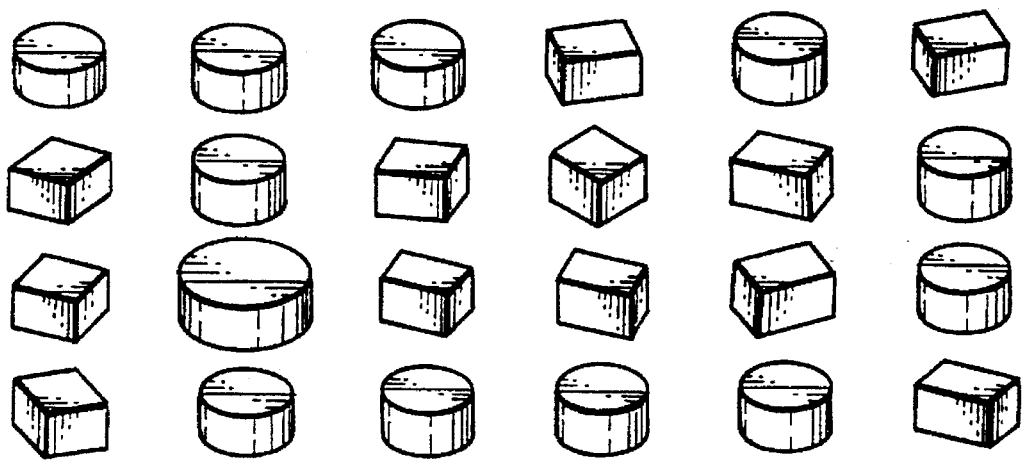
FIG. 12 is a perspective view showing a coupled quantum dots device according to a third embodiment of the invention.

FIG. 12 shows a coupled quantum dots device according to a third embodiment of the invention.

As shown in FIG. 12, in the coupled quantum dots device according to the third embodiment, a plurality of two kinds of quantum dots different in symmetry are periodically arranged at constant intervals. Quantum dots of one of the two kinds are cylindrical quantum dots having the rotational symmetry of 360 degrees, and those of the other kind are square prismatic quantum dots having the rotational symmetry of 90 degrees. The cylindrical quantum dots include at least two kinds of quantum dots which are different in diameter.

The coupled quantum dots device according to the third embodiment controls the electron tunneling between quantum dots by varying the shape (cylindrical shape or square prismatic shape) of quantum dots, relative angles between square prismatic quantum dots, the size of cylindrical quantum dots, and so on, in accordance with the intended use of the coupled quantum dots device. Thereby, the electron distribution is changed to effect information processing.

According to the third embodiment, even when the distance between quantum dots, hence the density of quantum dots, is fixed, the coupling strength between quantum dots, hence the transition probability of electrons between quantum dots, can be controlled by varying the shape of quantum dots, the relative angle between square prismatic quantum dots, the size of cylindrical quantum dots, and so on. Therefore, a coupled quantum dots device having a desired information processing function can be realized.

Figure 13:
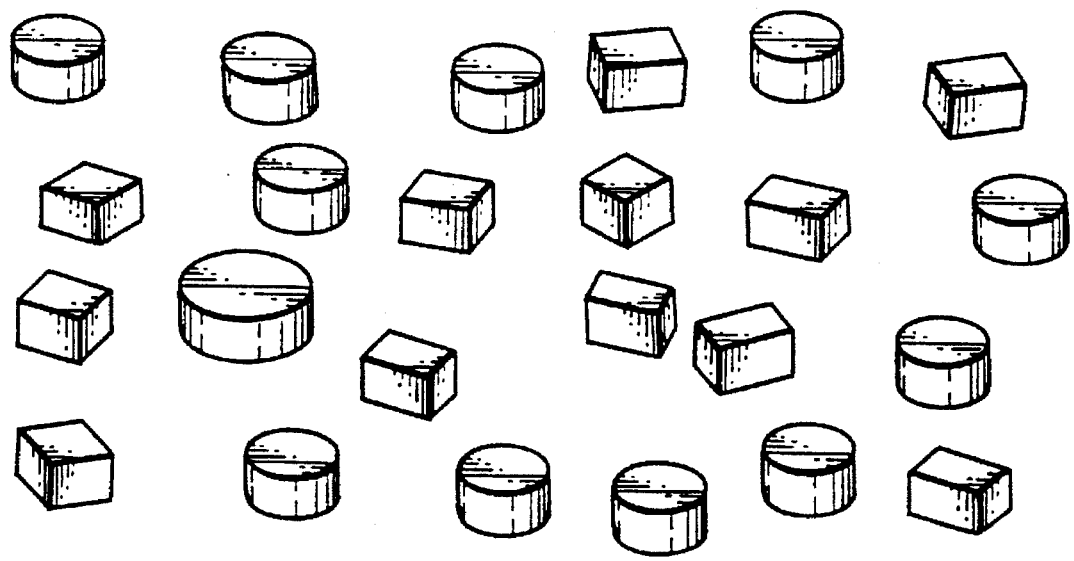
FIG. 13 is a perspective view showing a coupled quantum dots device according to a fourth embodiment of the invention.

FIG. 13 shows a coupled quantum dots device according to a fourth embodiment of the invention.

As shown in FIG. 13, the coupled quantum dots device according to the fourth embodiment is the same as the coupled quantum dots device according to the third embodiment in that two kinds of quantum dots different in symmetry, that is, cylindrical quantum dots and square prismatic quantum dots, are used. The fourth embodiment, however, is different from the third embodiment in that the quantum dots are arranged non-periodically and not at constant intervals.

The fourth embodiment permits more free design of coupled quantum dots devices because the transition probability of electrons between quantum dots can be controlled not only by varying the shape of quantum dots, the relative angle between square prismatic quantum dots, the size of cylindrical quantum dots, and so on, but also by changing the distance between quantum dots.

Figure 14:
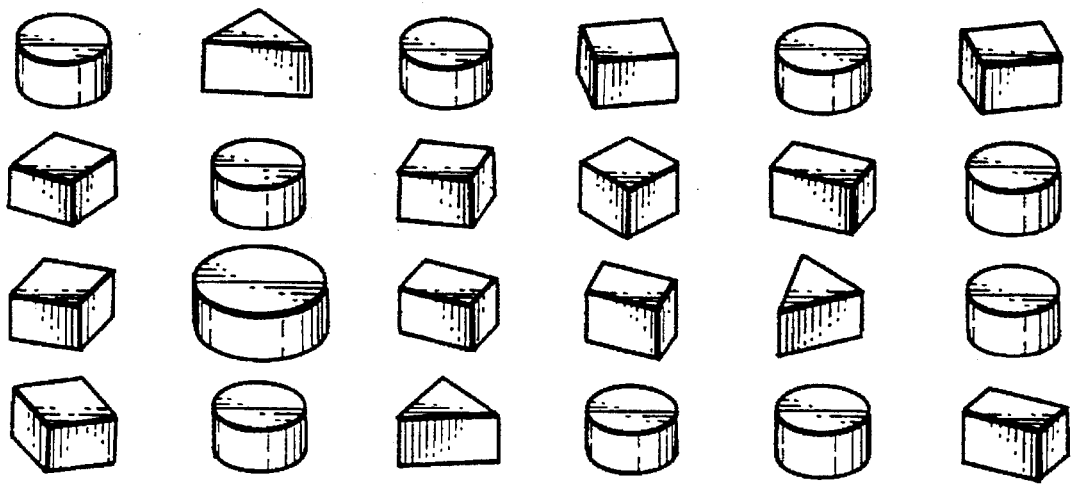
FIG. 14 is a perspective view showing a coupled quantum dots device according to a fifth embodiment of the invention.

FIG. 14 shows a coupled quantum dots device according to a fifth embodiment of the invention.

As shown in FIG. 14, in the coupled quantum dots device according to the fifth embodiment, three kinds of quantum dots different in symmetry are periodically arranged at constant intervals. Quantum dots of one of the three kinds are cylindrical quantum dots having the rotational symmetry of 360 degrees, those of another kind are square prismatic quantum dots having the rotational symmetry of 90 degrees, and those of the other kind are equilateral triangular prismatic quantum dots having the rotational symmetry of 120 degrees. The cylindrical quantum dots include at least two kinds which are different in diameter, as in the third embodiment.

According to the fifth embodiment, like the third embodiment, even when the distance between quantum dots, hence the density of quantum dots, is fixed, the transition probability of electrons between quantum dots, can be controlled by varying the shape of quantum dots (cylindrical, square prismatic and equilateral triangular prismatic shapes), the relative angle between square prismatic quantum dots, the size of cylindrical quantum dots, and so on. Thereby, a coupled quantum dots device having a desired information processing function can be realized.

Moreover, since the coupled quantum dots device according to the fifth embodiment uses three kinds of quantum dots: cylindrical quantum dots; square prismatic quantum dots; and equilateral triangular prismatic quantum dots, the degree of freedom in designing coupled quantum dots devices is greater than the coupled quantum dots device according to the third embodiment using two kinds of quantum dots: cylindrical quantum dots; and square prismatic quantum dots.

Methods for manufacturing the coupled quantum dots devices according to the third to fifth embodiments are the same as that of the first embodiment except that patterns and positions of masks are different. It is also possible to use a channel layer as in the second embodiment.

It was stated above that the transfer energy $\Delta E$ can be largely varied by changing the relative angle between quantum dots. A large variation in $\Delta E$ can also be attained by changing the distance 2r between quantum dots. However, there is a limit in variation by the latter method as explained below.

Figure 15:
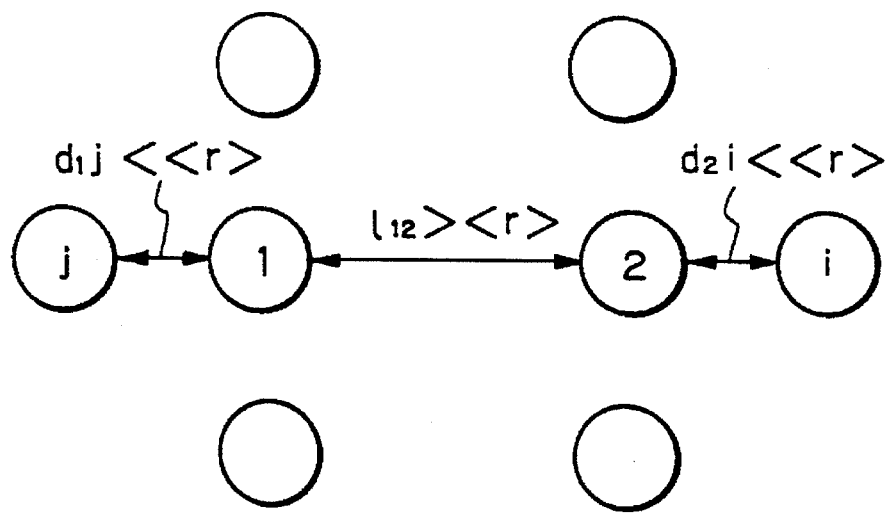
FIG. 15 is a schematic diagram for explaining the limit of variation in transfer energy $\Delta E$ by varying the relative distance among quantum dots.

Assume here that a coupled quantum dots system shown in FIG. 15 has N quantum dots in its entire area S. Then the average of distances among quantum dots, i.e. the mean distance, is determined as $<r>=(S/N)^{1/2}$. Therefore, the distance among quantum dots can be changed from the mean distance only by the order of fluctuation. In other words, if the distance $1^{12}$ between quantum dots 1 and 2 in FIG. 15 is increased, the distance $d_{1j}$ from the quantum dot 1 to another adjacent quantum dot j and the distance $d_{2i}$ from the quantum dot 2 to another adjacent quantum dot i necessarily become smaller than $<r>$ in average.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

For example, although the first and second embodiments were described as using square prismatic quantum dots 2, and the third to fifth embodiments as using square prismatic and equilateral triangular prismatic quantum dots 2, the invention may be applied to coupled quantum dots devices using quantum dots of other various geometries.

The third to fifth embodiments may also be modified as using cylindrical quantum dots and one or two kinds of polygonal prismatic quantum dots.

Further, by utilizing that the transfer energy $\overline{E}$ largely varies with relative angle $^-$ between quantum dots as shown in FIG. 4, the relative angle $^-$ between quantum dots may be varied in accordance with an intended use of the coupled quantum dots device.

Although the first to fifth embodiments were described as making quantum dots 2 in the form of AlGaAs/GaAs heterojunction, they may be made as, for example, GaSb/InAs heterojunction.

A coupled quantum wires device can be made by extending respective quantum dots in a direction vertical to the surface thereof in the coupled quantum dots device shown in, for example, FIG. 12, 13 or 14. In such a coupled quantum wires device, the transition probability of electrons between quantum wires can be controlled by controlling the coupling strength between the quantum wires with a method similar to that described in the aforementioned embodiments.

What is claimed is:

1. A method of manufacturing a quantum box device having a plurality of spaced quantum dots comprising the steps of:

a) forming a first GaAs layer having a thickness of a height of a quantum dot on an AlGaAs substrate, b) forming a resist layer on said first GaAs layer which has a pattern corresponding to that of the desired quantum dots, c) using said resist layer as a mask to remove said first GaAs layer where not covered by said resist layer, d) removing said resist layer, e) forming a second GaAs layer over the entire structure including the tops of the quantum dots, the side walls of the quantum dots and the top surface of said AlGaAs substrate between said quantum dots, f) removing said second GaAs layer on the tops of said quantum dots and on the top surface of said AlGaAs substrate, and g) forming a third AlGaAs layer over the entire structure.

2. The method for manufacturing a quantum box device according to claim 1 wherein said quantum dots are spaced a distant 1, said second GaAs layer has a thickness s, and said quantum dots are spaced a distant 1–2s.

3. The method for manufacturing a quantum box device according to claim 1 further comprising the step of providing a channel portion made of a third semiconductor among said quantum boxes on said semiconductor substrate.

4. The method for manufacturing a quantum box device according to claim 1 wherein said quantum box device include plural shapes of quantum dots which have different symmetries with respect to axes vertical to said semiconductor substrate.

5. The method for manufacturing a quantum box device according to claim 1 wherein said quantum box devices include at least cylindrical quantum dots and polygonal prismatic quantum dots.

6. The method for manufacturing a quantum device according to claim 5 wherein said quantum box device includes at least cylindrical quantum dots and quadrangular prismatic quantum dots.

7. A method of manufacturing a quantum box device having a plurality of spaced quantum dots comprising the steps of:

a) forming by a first GaAs layer having a thickness of a quantum dot on an AlGaAs substrate, b) forming a resist layer on said first GaAs layer which has a pattern corresponding to that of the desired quantum dots, c) using said resist layer as a mask to remove said first GaAs layer where not covered by said resist layer, d) removing said resist layer, e) forming a second GaAs layer over the entire structure including the tops of the quantum dots and the top surface of said AlGaAs substrate between said quantum dots, f) removing said second GaAs layer on the tops of said quantum dots and on the top surface of aid AlGaAs substrate, and g) forming a channel layer of GaAs over said second layer of GaAs on the top and side walls of said quantum dots and over the top surface of said AlGaAs substrate.

* * * * *